(12) United States Patent
Pinto et al.

(10) Patent No.: US 8,197,943 B2
(45) Date of Patent: Jun. 12, 2012

(54) PHOTOCROSSLINKABLE COMPOSITION COMPRISING A POLYORGANOSILOXANE

(75) Inventors: Olivier Pinto, Lyons (FR); Jérôme Alric, L'isle D'abeau (FR); Maud Thivillon, Thurins (FR)

(73) Assignee: Nexans, Paris (FR)

( * ) Notice: Subject to any disclaimer, the term of this patent is extended or adjusted under 35 U.S.C. 154(b) by 534 days.

(21) Appl. No.: 12/317,923

(22) Filed: Dec. 30, 2008

(65) Prior Publication Data
US 2009/0226739 A1    Sep. 10, 2009

(30) Foreign Application Priority Data

Jan. 4, 2008  (FR) ..................................... 08 50044

(51) Int. Cl.
*C08G 77/20* (2006.01)
*C08G 63/02* (2006.01)

(52) U.S. Cl. .......... 428/447; 430/17; 430/162; 430/166; 522/8; 522/13; 522/46; 522/68; 528/32

(58) Field of Classification Search .................. 428/447; 430/17, 162, 166; 522/8, 13, 46, 68; 528/32
See application file for complete search history.

(56) References Cited

U.S. PATENT DOCUMENTS

| 4,675,346 | A | 6/1987 | Lin et al. | 522/39 |
| 5,124,212 | A | 6/1992 | Lee et al. | 428/429 |
| 6,649,668 | B1 * | 11/2003 | David et al. | 522/15 |

OTHER PUBLICATIONS

French International Search Report dated Jul. 25, 2008.

* cited by examiner

*Primary Examiner* — Terressa Boykin
(74) *Attorney, Agent, or Firm* — Sofer & Haroun, LLP

(57) ABSTRACT

A photocrosslinkable composition has polyorganosiloxane P having a viscosity of at least 10 000 mPa·s at 25° C., wherein the polyorganosiloxane P has an acrylated silicone oil as a crosslinking agent, and a photoinitiator, the chemical structure of which comprises a diaryl ketone group.

21 Claims, 1 Drawing Sheet

PHOTOCROSSLINKABLE COMPOSITION COMPRISING A POLYORGANOSILOXANE

RELATED APPLICATION

This application claims the benefit of priority from French Patent Application No. 08 50044, filed on Jan. 4, 2008, the entirety of which is incorporated by reference.

FIELD OF THE INVENTION

The present invention relates to a photocrosslinkable composition, to an electric and/or optical cable comprising at least one crosslinked layer obtained from a photocrosslinkable composition, and also to a method of manufacturing said cable.

It typically, but not exclusively, applies to the manufacture of dielectric insulating layers or protective layers (protective sheath) for electric and/or optical cables.

In one exemplary embodiment, this composition is used to insulate electric cables known as ceramizable or safety cables.

DESCRIPTION OF THE PRIOR ART

Crosslinked silicone gums are typically used as a dielectric insulating layer for electric cables and have, in addition, good thermal stability properties over a wide temperature range which may extend from −50° C. to 200° C.

It is well known that the processes for the crosslinking (vulcanization) of silicone gums are conventionally initiated by the thermal decomposition reaction of peroxides.

More particularly, a polyorganosiloxane is mixed with a peroxide within one and the same extruder, and the crosslinking is carried out on exiting the extruder under the action of heat either by passing the extruded mixture inside a vulcanization tube, or by immersing said mixture in a salt bath.

However, these two high-temperature crosslinking processes necessitate high installation and maintenance costs.

Furthermore, when the peroxides used have a relatively low decomposition temperature, such as for example 4,4′-dichlorobenzoyl peroxide which decomposes from 40° C., the throughput of the extruder must be significantly limited because of the heating of the mixture due to the shear stresses inside the extruder, and therefore the speed of the production line must also be limited.

Specifically, this heating (self-heating) may lead to the premature crosslinking of the polyorganosiloxane in the extrusion equipment and thus damage said equipment.

The premature crosslinking of the polyorganosiloxane thus induces a degradation of the quality of the insulating layer obtained, in particular of its mechanical and dielectric properties.

In technical fields completely different from the cablemaking field, photocrosslinkable compositions are known that comprise a polyorganosiloxane, an acrylated silicone oil and a Norrish type I photoinitiator.

SUMMARY OF THE INVENTION

The objective of the present invention is to overcome the drawbacks of the techniques from the prior art by offering, in particular, a photocrosslinkable composition intended to be used in cablemaking and to be crosslinked at a relatively high rate while having good mechanical and dielectric properties once said composition is crosslinked.

A first subject of the present invention is a photocrosslinkable composition comprising a polyorganosiloxane P having a viscosity of at least 10 000 mPa·s at 25° C., characterized in that it additionally comprises:
- an acrylated silicone oil as a crosslinking agent; and
- a photoinitiator, the chemical structure of which comprises a diaryl ketone group.

According to one particular embodiment of this first subject, the photocrosslinkable composition may comprise at most 40 parts by weight of said acrylated silicone oil per 100 parts by weight of polyorganosiloxane P.

A second subject of the present invention is a photocrosslinkable composition comprising a polyorganosiloxane P having a viscosity of at least 10 000 mPa·s at 25° C., characterized in that it additionally comprises:
- at most 40 parts by weight of an acrylated silicone oil as a crosslinking agent per 100 parts by weight of polyorganosiloxane P; and
- a photoinitiator capable of extracting a hydrogen atom from the polyorganosiloxane P when said photoinitiator is subjected to actinic radiation.

A person skilled in the art will be able to easily identify this type of photoinitiator due to the fact of obtaining the crosslinking of the polyorganosiloxane P after irradiation of the photocrosslinkable composition under actinic radiation, said crosslinking being as determined by the methods described in the examples mentioned below.

According to one particular embodiment of this second subject, the chemical structure of said photoinitiator may comprise a diaryl ketone group.

The photochemical route for crosslinking the photocrosslinkable composition according to the present invention advantageously makes it possible to manufacture a crosslinked layer with a high productivity and, more particularly in the cablemaking field, it makes it possible to eliminate the problems of premature crosslinking in particular during the extrusion of said composition.

Moreover, the storage conditions of said photocrosslinkable composition are substantially facilitated, since the photocrosslinkable composition is unaffected by temperature variations of high amplitude ranging from −20° C. up to +50° C. and a premature crosslinking cannot thus take place.

In the text of the present invention, the expression "between a value v1 and a value v2" means that the values v1 and v2 are included in this range of values.

The polyorganosiloxanes P according to the present invention comprise both polyorganosiloxanes of viscosity between 10 000 mPa·s and 1 000 000 mPa·s at 25° C., namely liquid silicone rubbers (LSRs) and polyorganosiloxanes of viscosity greater than 1 000 000 mPa·s at 25° C., commonly known as ultra-high-viscosity silicone gums, or a mixture thereof.

The viscosity of the LSRs is preferably between 10 000 and 100 000 mPa·s, whereas the viscosity of the ultra-high-viscosity silicone gums is preferably between 10 000 000 and 50 000 000 mPa·s.

Since the viscosity of the silicone gums is constant over a wide temperature range, all the viscosities mentioned in the present invention are given at 25° C.

The viscosity of LSRs is conventionally measured, in the present invention, by Couette type rheometry at 25° C., this method is suitable for viscosity measurements ranging from 10 000 mPa·s to 100 000 mPa·s. For viscosity measurements ranging from 100 000 mPa·s to 1 000 000 mPa·s, the viscosity of the LSRs in the present invention is conventionally measured by plate-plate or cone-plate type rheometry at 25° C.

The viscosity of the ultra-high-viscosity silicone gums is conventionally measured, in the present invention, by dynamic rheometry or capillary rheometry at 25° C., with a shear rate of around 1 s$^{-1}$.

Said polyorganosiloxanes P are generally represented by the formula I below:

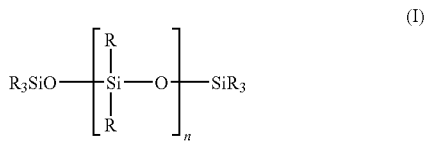

in which n is an integer that is a function of the viscosity of the polyorganosiloxane, preferably n is greater then 500; the R groups comprise identical or different hydrocarbon-based radicals chosen from alkyl, in particular $C_{1-20}$ alkyl, haloalkyl, cycloalkyl, aralkyl and/or cyanoalkyl groups.

As a preferred example, the R group represents a methyl group.

Advantageously, the R groups may comprise at least 50% of one of the groups mentioned previously.

The R groups may comprise, in addition, other identical or different hydrocarbon-based radicals chosen from alkenyl, haloalkenyl, cycloalkenyl, aryl, haloaryl and/or alkaryl groups.

The preferred polyorganosiloxane P according to the formula I is polydimethylsiloxane (PDMS).

The acrylated silicone oils according to the present invention comprise at least one acrylate or methacrylate group and preferably have a viscosity between 100 and 1000 mPa·s at 25° C., preferably between 250 and 450 mPa·s at 25° C. The viscosity of the acrylated silicone oils is conventionally measured, in the present invention, by Couette type rheometry at 25° C.

These acrylated silicone oils may be defined by one or other of the formulae IIa or IIb below:

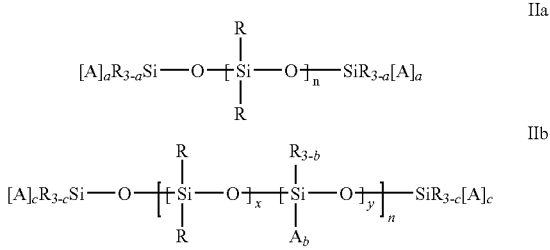

in which n is an integer less than or equal to 1000; x is a number between 0.80 and 0.99; y is a number between 0.01 and 0.20; the R groups are identical or different hydrocarbon-based radicals preferably chosen from $C_{1-20}$ alkyl, haloalkyl, cycloalkyl, aralkyl, cyanoalkyl, alkenyl, haloalkenyl, cycloalkenyl, aryl, haloaryl and/or alkaryl groups; a is an integer equal to 1, 2 or 3; b is an integer equal to 1 or 2; c is an integer equal to 0, 1, 2 or 3; A is a group comprising an acrylate or a methacrylate, the A group possibly comprising, in addition, a divalent bonding group between the silicon and the acrylate or methacrylate.

By way of example, the acrylated silicone oil is advantageously the acrylated polydimethylsiloxane, the formula IIa or IIb of which is defined by a=1, b=1, c=1 and A=acrylate.

The photoinitiator of the composition according to the present invention is a Norrish type II photoinitiator. The expression "Norrish type II photoinitiator" is understood to mean a chemical compound which, when it is subjected to actinic radiation, in particular to ultraviolet (UV) radiation, passes to an excited state known as a triplet state. This triplet state thus allows the chemical compound to extract a hydrogen atom from the polyorganosiloxane P according to the present invention, which leads to the formation of a polyorganosiloxane P macroradical capable of crosslinking with the crosslinking agent.

Thus, the Norrish type II photoinitiators are very different from the Norrish type I photoinitiators. Even though these two types of photoinitiators have the ability to generate free radicals following the absorption of actinic radiation such as ultraviolet radiation, the Norrish type I photoinitiator is known for being able to initiate the formation of radicals under ultraviolet radiation by homolytic scission of its intramolecular bonds, these radicals not being capable of extracting a hydrogen atom from the polyorganosiloxane P.

By way of example, the photoinitiator according to the present invention, the chemical structure of which comprises, in particular, a diaryl ketone group, may be chosen from benzophenone, dibenzosuberone, xanthone, anthrone, anthraquinone and derivatives thereof, or a mixture thereof.

In one particular embodiment, the composition according to the invention may comprise at most 20 parts by weight of acrylated silicone oil per 100 parts by weight of polyorganosiloxane P, preferably at most 10 parts by weight of acrylated silicone oil per 100 parts by weight of polyorganosiloxane P, and more preferably still at most 5 parts by weight of acrylated silicone oil per 100 parts by weight of polyorganosiloxane P.

In another particular embodiment, the composition according to the invention may comprise at most 10 parts by weight of photoinitiator per 100 parts by weight of polyorganosiloxane P, preferably at most 5 parts by weight of photoinitiator per 100 parts by weight of polyorganosiloxane P, and more preferably still at most 2 parts by weight of photoinitiator per 100 parts by weight of polyorganosiloxane P.

In another embodiment, the composition may additionally comprise another initiator, the latter being different from the photoinitiator capable of extracting a hydrogen atom from the polyorganosiloxane P when said photoinitiator is subjected to actinic radiation.

The other initiator is capable of generating free radicals under the effect of heat or actinic radiation.

Said initiator capable of generating free radicals under the effect of heat may be an organic peroxide, such as for example 4,4'-dichlorobenzoyl peroxide. The composition may preferably comprise at most 0.3 part by weight of organic peroxide per 100 parts by weight of polyorganosiloxane P.

Said initiator capable of generating free radicals under the effect of actinic radiation may be a Norrish type I photoinitiator, such as for example 2,4,6-trimethylbenzoylphosphine oxide (MAPO) or diphenyl-(2,4,6-trimethylbenzoyl)phosphine oxide (BAPO).

Another subject according to the present invention is an electric and/or optical cable comprising at least one crosslinked layer obtained from a photocrosslinkable composition according to the invention, or in other words a crosslinked layer of polyorganosiloxane P.

Said cable may additionally comprise a filled polyolefin layer, said layer possibly being crosslinked.

The filled polyolefin layer is preferably of the HFFR type (halogen free flame retardant) and comprises a polyolefin matrix and a filler known as a flame-retardant filler well known to a person skilled in the art.

By way of example, the polyolefin is a polymer of ethylene or of propylene and the flame-retardant filler is a metallic hydroxide such as an aluminum trihydroxide or a magnesium dihydroxide.

When the conductive element of the electric and/or optical cable is surrounded by these two layers, it is preferred that the crosslinked layer of polyorganosiloxane P, around the conductive element, be covered with the filled polyolefin layer.

Thus, the crosslinked layer of polyorganosiloxane P, conventionally having a low abrasion resistance, is protected by said filled polyolefin layer, the latter having, on the other hand, a very good abrasion resistance.

Another subject according to the present invention is a method of manufacturing said electric and/or optical cable, said method comprising a step i of irradiating the photocrosslinkable composition under actinic radiation, preferably under ultraviolet radiation, to obtain the crosslinked layer of polyorganosiloxane P.

This method makes it possible to obtain a crosslinked layer of polyorganosiloxane P with the aid of a method that is easy to use, has a high productivity and is very economic with respect to the methods of the prior art used for crosslinking via a thermal route.

The mechanical and dielectric properties of the crosslinked layer of polyorganosiloxane P obtained by the manufacturing method according to the present invention are equivalent, or even better, than those obtained by the conventional methods of high-temperature crosslinking of silicone gums used in cablemaking.

Advantageously, the step i may be preceded by a step of extruding the photocrosslinkable composition according to the present invention.

The method of crosslinking via a photochemical route according to the present invention makes it possible to avoid any premature crosslinking reaction in the extrusion equipment due to self-heating of the photocrosslinkable composition during the extrusion process.

Furthermore, the crosslinking of the polyorganosiloxane P is carried out at ambient temperature and therefore does not require the photocrosslinkable composition to be heated, in particular after it has exited the extruder.

It is thus perfectly conceivable to adjust the degree of crosslinking of the polyorganosiloxane P and therefore to adapt its mechanical properties by carrying out one or more irradiations under actinic radiation, more particularly one or more passes through a UV radiation oven.

In this way, the extrusion speed is not limited by the crosslinking kinetics of the silicone gum.

When the electric and/or optical cable according to the present invention additionally comprises the filled polyolefin layer mentioned above, the method of manufacturing said cable comprises said step i followed by a step ii of bringing said crosslinked layer of polyorganosiloxane P into contact with said filled polyolefin layer, to obtain a two-layer material.

This method makes it possible to obtain a two-layer material of high added value with the aid of a method that is easy to use and has a high productivity, said two-layer material combining very good dielectric and mechanical properties with excellent flame-retardant behavior.

Advantageously, bringing the filled polyolefin layer from step ii into contact with the crosslinked layer of polyorganosiloxane P from step i may be obtained from the extrusion of a filled polyolefin directly around the layer from step i.

Other features and advantages of the present invention will appear in light of the examples which follow with reference to the appended figures, said examples and figures being given by way of illustration and being in no way limiting.

DETAILED DESCRIPTION

Examples

Figure 1:
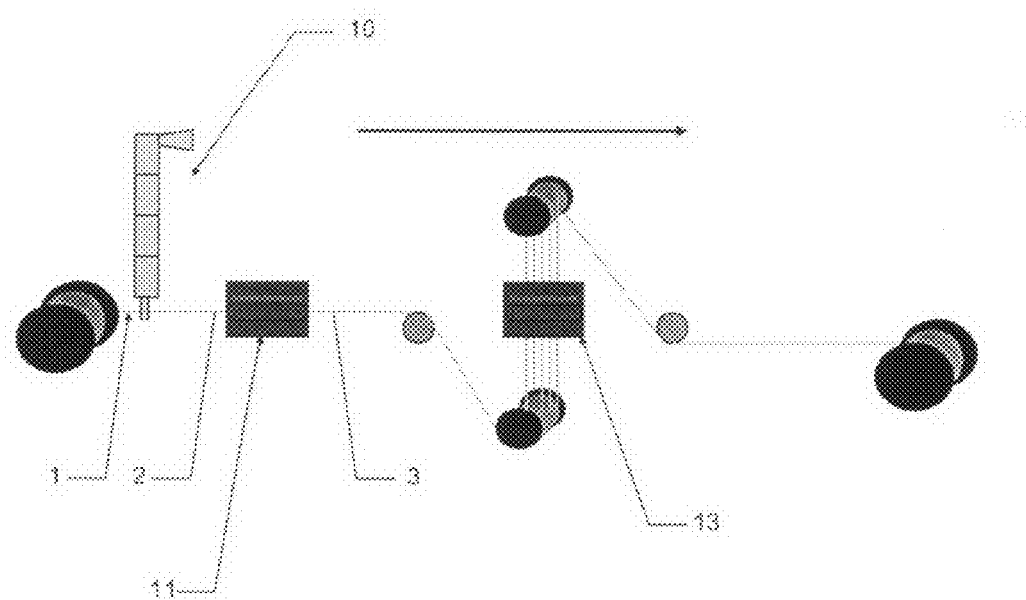
FIG. 1 schematically represents a method for manufacturing a cable comprising at least one crosslinked layer according to the present invention.

In order to demonstrate the advantages obtained with the photocrosslinkable compositions according to the present invention, the degree of crosslinking, the hot creep and also certain mechanical properties of the crosslinked layers according to the invention and the prior art have been studied.

The degree of crosslinking (or gel rate) of a crosslinked layer is typically determined by extraction of a sample of said layer in xylene at 110° C. for 24 hours.

As for the measurement of the hot creep of a material under mechanical stress, this is determined according to the NF EN 60811-2-1 standard.

This corresponding test is commonly denoted by the expression Hot Set Test and consists in weighting one end of a H2 dumbbell type test specimen with a mass corresponding to the application of a stress equivalent to 0.2 MPa, and in placing the assembly in an oven heated at 200±1° C. for a period of 15 minutes.

At the end of this period, the maximum heat elongation of the test specimen under stress is noted, expressed in %.

The suspended mass is then removed, and the test specimen is kept in the oven for a further 5 minutes.

The permanent elongation remaining, also known as set (or permanent set) is then measured before being expressed in %.

It is recalled that the more a material is crosslinked, the lower the maximum elongation under stress and set values will be.

It is furthermore specified that in the case where a test specimen breaks during the test, under the combined action of the mechanical stress and of the temperature, the result of the test will then be logically considered to be a failure.

The mechanical properties of a crosslinked layer, in particular the tensile strength and elongation at break, are determined by cutting out H2 dumbbell type test specimens according to the NF EN 60811-1-1 standard.

The test specimens thus prepared, the thickness of which is measured with precision, are then tested on a mechanical tensile-testing machine. The pull rate is 200 mm/min.

1. First Series of Tests on a Crosslinked Layer Carried Out in a Press

A first series of tests consists in studying, in particular, the mechanical properties of a crosslinked layer (or crosslinked film) according to the present invention and according to the prior art.

The compositions described in this first series of tests were prepared by mixing their respective constituents on a mill at ambient temperature.

Before incorporating the crosslinking agent (acrylated silicone oil) into the polyorganosiloxane P matrix, this crosslinking agent may first be adsorbed onto silica (AEROSIL R202 DEGUSSA) in order to facilitate its dispersion in the polyorganosiloxane matrix.

Moreover, in order to avoid exudation of the photoinitiator after the mixing step, an organic solvent with a low boiling point, such as ethyl acetate, may be used.

1.a. Crosslinked Layers Based on Liquid Silicone

The mechanical properties of crosslinked layers based on a liquid silicone elastomer (LSR) (polyorganosiloxane P) were studied.

100 parts by weight of part A of an LSR of viscosity between 10 000 mPa·s and 100 000 mPa·s composed of a blend of hydrogenated silicone oil and of vinylated silicone oil (referenced LSR8540-A and sold by BLUESTAR SILICONES) were mixed with 5 parts by weight of acrylated silicone oil having a viscosity of between 250 and 450 mPa·s (referenced TEGORAD 2700 and sold by TEGO) and with 2 parts by weight of benzophenone (referenced Darocur BP and sold by CIBA).

The composition thus mixed was formed in a press at ambient temperature (25° C.) to obtain a layer having a thickness of 550 μm.

The sheet thus obtained was photocrosslinked by successive passes on a UV conveyor (LC6 UV FUSION) equipped with a UV oven (HP6 FUSION UV—200 W/cm) and a medium pressure mercury vapor lamp of D type (Irradiance 6700 W/cm$^2$).

After 10 successive passes at a speed of 2.5 m/min in said UV oven, a crosslinked layer according to the present invention was obtained.

At the same time, 100 parts by weight of parts A and B of the silicone elastomer (LSR) were thermally crosslinked for one hour at 120° C., the part B of the silicone elastomer typically comprising a mixture of vinylated silicone oil and a hydrosilylation catalyst.

The layer obtained by the photochemical route according to the invention had an elongation at break comparable to that of the layer obtained by the thermal route in the presence of a catalyst, namely 350%.

1.b. Crosslinked Layers Based on a High-Temperature Vulcanizable Elastomer

The gel rate, the hot creep and also the mechanical properties of crosslinked layers based on a high-temperature vulcanizable (HTV) elastomer (polyorganosiloxane P) were studied.

Layers having a thickness of 800 μm were produced with a high-temperature vulcanizable elastomer having a viscosity between 10 000 000 mPa·s and 50 000 000 mPa·s, used as a base in safety cable insulation.

Table 1 below gives details of the various compositions used to form crosslinked layers according to the prior art (compositions A1 and A2) and according to the present invention (compositions B and C).

In this respect, it is noted that the quantities mentioned in Table 1 are expressed in parts by weight per 100 parts by weight of polyorganosiloxane P.

TABLE 1

| Composition | A1 | A2 | B | C |
|---|---|---|---|---|
| ELASTOSIL R502/75 | 100 | 100 | 100 | 100 |
| 4,4'-Dichlorobenzoyl peroxide | 0.6 | — | — | 0.25 |
| BAPO | — | 0.5 | — | — |
| Darocur BP | — | — | 0.5 | 0.5 |
| Tegorad 2700 | — | 5 | 5 | 5 |

The origin of the constituents from Table 1 is the following:
ELASTOSIL R502/75 is the reference for a high-temperature vulcanizable elastomer having a viscosity between 10 000 000 mPa·s and 50 000 000 mPa·s at 25° C., sold by WACKER SILICONES;
the 4,4'-dichlorobenzoyl peroxide is supplied by WACKER SILICONES;
BAPO is the 2,4,6-trimethylbenzoylphosphine oxide, referenced Irgacure 819 and sold by CIBA;
Darocur BP is the reference for a benzophenone sold by CIBA; and
Tegorad 2700 is the reference for an acrylated silicone oil sold by TEGO.

The composition A1 is formed in a press at 200° C. for 10 seconds (crosslinking via a thermal route).

As for the compositions A2, B and C, these are formed in a press at ambient temperature (25° C.) and photocrosslinked under the same conditions as the crosslinked layer based on LSR described previously (10 successive passes at 5 m/min).

The gel rate, the hot creep and also the mechanical properties characteristic of the crosslinked layers obtained are presented in Table 2 below:

TABLE 2

| Crosslinked layer | A1 | A2 | B | C |
|---|---|---|---|---|
| Gel rate (%) (extraction in xylene at 110° C. for 24 h) | 96 | <5 | 95 | 96 |
| Hot creep (at 250° C. and at 0.2 MPa for 15 min) | | | | |
| maximum heat elongation under stress (%) | 10 | Failure | 10 | 10 |
| permanent set (%) | 0 | Failure | 0 | 0 |
| Mechanical properties (without aging) | | | | |
| tensile strength (MPa) | 7.3 | Nil | 5.2 | 5.8 |
| elongation at break (%) | 620 | Nil | 540 | 490 |
| Mechanical properties after aging in air (at 200° C. for 240 h) | | | | |
| tensile strength (MPa) | 5.0 | Nil | 4 | 4.2 |
| elongation at break (%) | 260 | Nil | 140 | 125 |

The layers B and C crosslinked via a photochemical route have degrees of crosslinking and mechanical properties substantially equivalent to those obtained with the layer A1 crosslinked via a thermal route.

Furthermore, it is noticed that the use of a Norrish type I photoinitiator such as BAPO does not make it possible to obtain a sufficient gel rate for the characterization of the hot creep and of the mechanical properties of the "crosslinked" layer A2.

In addition, the characteristics of the hot creep and also the mechanical properties of the crosslinked layers B and C correspond to the BS7655 standard relating to security cables comprising an elastomeric dielectric insulation.

The BS7655 standard recommends, for the hot creep, a maximum heat elongation under stress of less than 100% and a permanent set of less than 25%.

It also recommends a tensile strength greater than or equal to 5 MPa and an elongation at break greater than or equal to 150% for crosslinked layers "without aging".

When the crosslinked layers undergo aging at 200° C. for 240 hours in air, the tensile strength and the elongation at break recommended by the BS7655 standard are respectively greater than or equal to 4 MPa and greater than or equal to 120%.

It is interesting to note that, by combining a very small amount of peroxide (0.2 parts by weight) with a Norrish type II photoinitiator according to composition C, the mechanical properties of the crosslinked layer C are remarkably improved compared to the crosslinked layer B.

This is because the vulcanization by the peroxide stems from the fact that some of the radiation from the UV oven generates infrared radiation that enables the peroxide to decompose and participate in the crosslinking of the polyorganosiloxane P.

Since this amount of peroxide is relatively small, in particular less than half the amount of peroxide from composition A, the risks of premature crosslinking in the extrusion equipment are significantly limited.

1.c. Crosslinked Layers Based on Ultra-High-Viscosity Silicone

The mechanical properties of crosslinked layers based on ultra-high-viscosity silicone (polyorganosiloxane P) were studied.

100 parts by weight of ultra-high-viscosity polydimethylsiloxane (PDMS) (viscosity between 10 000 000 mPa·s and 50 000 000 mPa·s) (referenced GENIOPLAST Pellet S and sold by WACKER SILICONES) were mixed with 5 parts by weight of a diacrylated silicone oil (referenced TEGORAD 2700 and sold by DEGUSSA) and with 0.5 part by weight of a benzophenone (referenced DAROCUR BP and sold by CIBA) (composition D).

Layers crosslinked by a photochemical route were prepared from said mixture (composition D) after 3 successive passes at a speed of 5 m/min under the UV conveyor (LC6 UV FUSION) equipped with a UV oven (HP6 FUSION UV 200 W/cm) and with a medium pressure mercury vapor lamp of D type (Irradiance 6700 W/cm$^2$).

The mechanical properties of the crosslinked layers D1 and D2 obtained from the composition D are listed in Table 3 below.

TABLE 3

| Crosslinked layer | D1 | D2 |
| --- | --- | --- |
| Thickness (mm) | 0.200 | 0.850 |
| Mechanical properties (without aging) | | |
| tensile strength (MPa) | 6.5 | 5.5 |
| elongation at break (%) | 680 | 1010 |

It is thus observed that the mechanical properties of the layers D1 and D2 crosslinked via a photochemical route are retained when the thickness of the layer changes from 0.200 mm to 0.850 mm.

2. Second Series of Tests on a Crosslinked Layer of an Electric Cable, Formed by Extrusion A second series of tests consists in studying the gel rate and also the mechanical properties of the crosslinked layer (or crosslinked film) of polyorganosiloxane P of a cable according to the present invention.

The method of manufacturing said cable comprising said crosslinked layer according to the present invention is represented schematically in FIG. 1.

The horizontal arrow in FIG. 1 represents the direction of manufacture of said cable, the speed of the production line being of the order of 20 m/min.

The photocrosslinkable composition used to obtain the crosslinked layer is the composition C from Table 1.

The composition C is first loaded into an extruder 10, then is extruded directly around a conductive element of copper wire type 1 having a diameter of 1 mm, the insulating layer 2 formed around said conductor having a thickness of 0.900 mm.

The copper wire 1 surrounded by the extruded insulating layer 2 then passes through a UV chamber 11 (DRF10 FUSION UV) equipped with a medium pressure mercury vapor lamp of D type—240 W/cm (F600 FUSION UV—Irradiance 7500 W/cm$^2$) to obtain a crosslinked layer 3.

The electric cable thus formed is on the one hand wound around a cable drum (not shown) without said layer being deformed in order to carry out a first series of tests and, on the other hand, then passed 10 times consecutively through another UV chamber 13, according to FIG. 1, in order to extend the crosslinking of the crosslinked layer 3 and to carry out a second series of tests.

Of course, a single UV chamber could also be used to carry out one or more irradiations of the extruded insulating layer 2.

Table 4 below lists the first and second series of tests concerning the gel rate and also the mechanical properties of the crosslinked layer 3 around the copper electrical conductor.

TABLE 4

| Crosslinked layer<br>Speed of the production line | | E1<br>8 m/min | E2<br>18 m/min |
| --- | --- | --- | --- |
| After extrusion and 1 pass through the UV oven 11 | Gel rate (%) | 94 | 90 |
| | Mechanical properties (without aging) | | |
| | tensile strength (MPa) | 4.9 | 3.2 |
| | elongation at break (%) | 321 | 442 |
| After extrusion, 1 pass through the UV oven 11 and 10 additional passes through the UV oven 13 | Gel rate (%) | 96 | 95 |
| | Mechanical properties (without aging) | | |
| | tensile strength (MPa) | 4.3 | 3.8 |
| | elongation at break (%) | 124 | 178 |

Thus, it is advantageously observed that the gel rate and the mechanical properties are substantially equivalent when the speed of the production line changes from 8 meters per minute to 18 meters per minute.

3. Third Series of Tests on a Two-Layer Material of an Electric Cable, Formed by Extrusion A third series of tests consists in studying the hot creep, the mechanical properties, and also the fire resistance properties and dielectric properties of a two-layer material of a cable according to the invention, said two-layer material comprising a crosslinked layer directly in contact with a filled polyolefin layer.

Figure 2:
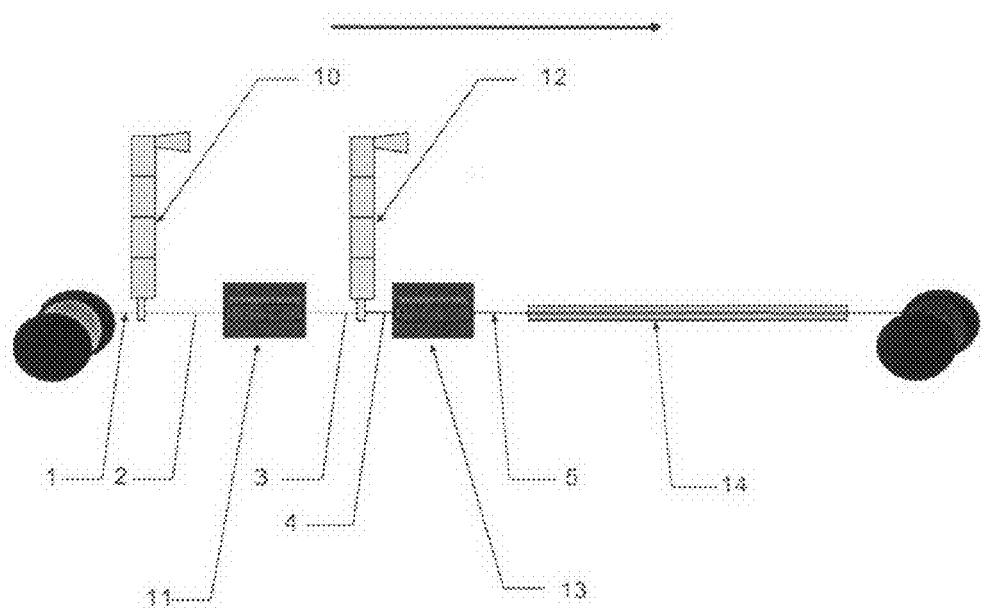
FIG. 2 schematically represents a method of manufacturing a cable comprising a crosslinked layer and another layer comprising a filled polyolefin according to the present invention.

The method of manufacturing said cable comprising the two-layer material is represented schematically in FIG. 2.

The horizontal arrow in FIG. 2 represents the direction of manufacture of said cable, the speed of the production line being of the order of 20 m/min.

The composition used to obtain the crosslinked layer of the two-layer material is the composition D described previously.

The composition is first loaded into a first extruder 10, then is extruded directly around a conductive element of copper wire type 1 having a diameter of 0.85 mm, the insulating layer 2 formed around said conductor having a thickness of 0.200 mm.

The copper wire 1 surrounded by the extruded insulating layer 2 then passes through a UV chamber 11 (DRF10 FUSION UV) equipped with a medium pressure mercury vapor lamp of D type—240 W/cm (F600 FUSION UV—Irradiance 7500 W/cm$^2$) to obtain a crosslinked layer 3.

Then, a mixture comprising a polypropylene matrix and a flame-retardant filler is extruded in the molten state, using a second extruder 12, directly around the crosslinked layer 3 of polyorganosiloxane P in a thickness of 0.200 mm.

The filled polypropylene layer 4 thus obtained is then crosslinked by passing through a UV chamber 13 (DRF10 FUSION UV) equipped with a medium pressure mercury vapor lamp of D type—240 W/cm (F600 FUSION UV—Irradiance 7500 W/cm$^2$).

The cable 5, more particularly the crosslinked layer of filled polyolefin, is then cooled in a cooling tank 14.

The filled polypropylene layer 4 in direct contact with the crosslinked layer 3 of polyorganosiloxane P thus forms the two-layer material.

In order to demonstrate the advantages of the two-layer material according to the invention, the hot creep and the mechanical properties of the cable 5 thus obtained, referenced MB1 for the tests, were determined according to the NF EN 60811 standard.

Moreover, the fire resistance properties and the dielectric properties were also measured.

The fire resistance properties were characterized in accordance with the IEC 60332-1 standard describing the flame propagation test.

Thus, the test sample for this test was a portion of the cable 5, as obtained from the method described above according to FIG. 2, of around 600 mm in length.

This sample was aligned vertically and attached to two supports so that the distance between these supports was around 550 mm.

The burner was placed so as to have an angle of 45° between the flame and the sample, the blue cone of the flame having to touch the surface of the sample.

The flame was applied continuously for a period of 60 seconds.

At the end of the specified time, the burner was moved away and the flame extinguished.

The criteria for success of the flame propagation test are the distance burnt and the extinction time of the flame.

In order for the sample to successfully pass the test, it is necessary that the distance burnt does not exceed 375 mm at the end of the test.

The dielectric properties of the cable were characterized in accordance with the EN 50305 standard describing the direct current stability test.

Thus, the test sample for this test was a portion of the cable 5, as obtained from the method described above according to FIG. 2, of at least 5 m in length arranged in a loop.

Said loop was submerged in a solution of distilled water containing 3% sodium chloride, at a temperature of 85° C. and for 240 h under a direct current voltage of 300V.

In order to do this, one electrode was connected to the two unsubmerged ends of the cable, whilst the second electrode was immersed in the solution containing the submerged cable.

The current flowing in the circuit (leakage current) was measured continuously throughout the test.

At the end of the test, no breakdown of the insulating envelope should be observed.

In order to easily compare the advantages of the two-layer material according to the present invention, the flame propagation test and the direct current stability test were also carried out:

on a cable referenced C1 obtained from the method described previously according to FIG. 1 comprising a single photocrosslinked layer obtained from composition D (thickness of 0.200 mm) according to the invention; and on a cable referenced C2 obtained from the method according to FIG. 2, but only comprising the step relating to the crosslinked layer of filled polypropylene (thickness of 0.350 mm), or in other words the cable C2 comprised a conductive element surrounded by a single crosslinked layer of filled polypropylene.

TABLE 5

| Cable | MB1 | C1 | C2 |
|---|---|---|---|
| Hot creep (at 250° C. and at 0.2 MPa for 15 min) | | | |
| maximum heat elongation under stress (%) | 30 | / | / |
| permanent set (%) | 0 | | |
| Mechanical properties (without aging) | | | |
| tensile strength (MPa) | 12 | / | / |
| elongation at break (%) | 200 | | |
| Flame propagation | | | |
| average distance burnt (mm) | 135 | 118 | 130 |
| average extinction time (s) | 6 | 0 | 9 |
| Dielectric stability | | | |
| breakdown resistance (h) | 180 | / | 2.5 |

While having good fire resistance properties, the MB1 cable insulated with the two-layer material lasts on average 180 hours before a breakdown of the insulator is observed (over 5 samples tested) contrary to the cable C2 insulated with a single filled polyolefin layer that only lasts 2 h 30 min.

Consequently, the crosslinked layer of polyorganosiloxane P, surrounded by the filled polyolefin layer, makes it possible to obtain a two-layer material having significantly improved dielectric properties as is shown by the results obtained for the cable MB1 according to the invention and the cable C2.

The present invention is not limited to the examples of compositions and implementations that have just been described and relates in its general points to all photocrosslinkable compositions conceivable from general indications supplied in the statement of the invention.

In particular, the photocrosslinkable compositions according to the present invention may also be used in fields of application other than that of cablemaking, such as for example for applications relating to coatings in the textile field or in the field of paper.

The invention claimed is:

1. A photocrosslinkable composition comprising:
   a polyorganosiloxane P having a viscosity of at least 10 000 mPa.s at 25° C.;
   an acrylated silicone oil as a crosslinking agent, the acrylated silicone oil being a different component from the polyorganosiloxane P; and
   a photoinitiator, the chemical structure of which includes a diaryl ketone group.

2. The composition as claimed in claim 1, wherein said polyorganosiloxane P is at most 40 parts by weight of said acrylated silicone oil per 100 parts by weight of polyorganosiloxane P.

3. A photocrosslinkable composition comprising:
   a polyorganosiloxane P having a viscosity of at least 10 000 mPa.s at 25° C.;
   an acrylated silicone oil as a crosslinking agent where the photocrosslinkable composition has at most 40 parts by weight of said acrylated silicone oil per 100 parts by weight of polyorganosiloxane P, the acrylated silicone oil being a different component from said polyorganosiloxane P; and a photoinitiator capable of extracting a hydrogen atom from the polyorganosiloxane P when said photoinitiator is subjected to actinic radiation.

4. The composition as claimed in claim 3, wherein the chemical structure of said photoinitiator comprises a diaryl ketone group.

5. The composition as claimed in claim 1, wherein the photoinitiator is chosen from benzophenone, dibenzosuberone, xanthone, anthrone, anthraquinone and derivatives thereof, or a mixture thereof.

6. The composition as claimed in claim 1, wherein the polyorganosiloxane is chosen from polyorganosiloxanes having a viscosity between 10 000 mPa·s and 100 000 mPa·s at 25° C., and polyorganosiloxanes having a viscosity between 10 000 000 mPa·s and 50 000 000 mPa·s at 25° C., or a mixture thereof.

7. The composition as claimed in claim 1, wherein the polyorganosiloxane P is a polydimethylsiloxane (PDMS).

8. The composition as claimed in claim 1, wherein the acrylated silicone oil has a viscosity between 100 and 1000 mPa·s at 25° C.

9. The composition as claimed in claim 1, wherein said polyorganosiloxane P includes at most 20 parts by weight of acrylated silicone oil per 100 parts by weight of polyorganosiloxane P.

10. The composition as claimed in claim 1, wherein said polyorganosiloxane P includes at most 10 parts by weight of photoinitiator per 100 parts by weight of polyorganosiloxane P.

11. The composition as claimed in claim 1, further comprising another initiator capable of generating free radicals under the effect of heat or actinic radiation.

12. The composition as claimed in claim 11, wherein the initiator capable of generating free radicals under the effect of heat is an organic peroxide.

13. The composition as claimed in claim 12, wherein initiator capable of generating free radicals under the effect of heat is at most 0.3 part by weight of organic peroxide per 100 parts by weight of polyorganosiloxane P.

14. The composition as claimed in claim 11, wherein the initiator capable of generating free radicals under the effect of actinic radiation is a Norrish type I photoinitiator.

15. An electric and/or optical cable comprising:
at least one crosslinked layer, wherein said layer is obtained from a photocrosslinkable composition as defined in claim 1.

16. The cable as claimed in claim 15, wherein said cable further comprises a filled polyolefin layer.

17. A method of manufacturing an electric and/or optical cable according to claim 15, said method comprising a step of:
i) irradiating the photocrosslinkable composition under actinic radiation to obtain the crosslinked layer.

18. The manufacturing method as claimed in claim 17, applied to an optical cable having a filled polyolefin layer, said method further comprising the step of:
following step i), ii) bringing said crosslinked layer into contact with the filled polyolefin layer.

19. The manufacturing method as claimed in claim 17, wherein step i) is preceded by a step of extruding the photocrosslinkable composition.

20. The composition as claimed in claim 1, wherein the acrylated silicone oil has at least one acrylate or methacrylate group.

21. The composition as claimed in 3, wherein the acrylated silicone oil has at least one acrylate or methacrylate group.

* * * * *